United States Patent
Flagello et al.

(10) Patent No.: US 7,221,501 B2
(45) Date of Patent: May 22, 2007

(54) STATIONARY AND DYNAMIC RADIAL TRANSVERSE ELECTRIC POLARIZER FOR HIGH NUMERICAL APERTURE SYSTEMS

(75) Inventors: Donis Flagello, Scottsdale, AZ (US); Kevin Cummings, Phoenix, AZ (US); Alexander Straaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/106,480

(22) Filed: Apr. 15, 2005

(65) Prior Publication Data

US 2005/0180008 A1 Aug. 18, 2005

Related U.S. Application Data

(63) Continuation of application No. 10/374,509, filed on Feb. 27, 2003, now Pat. No. 6,943,941.

(51) Int. Cl.
*G02B 5/30* (2006.01)
*G02B 27/28* (2006.01)
*G02B 27/72* (2006.01)

(52) U.S. Cl. .................. 359/352; 359/486; 359/495; 355/71

(58) Field of Classification Search .......... 359/350, 359/352, 486, 495; 355/71
See application file for complete search history.

(56) References Cited

U.S. PATENT DOCUMENTS

| 3,601,469 | A | * | 8/1971 | Siksai ................. 359/489 |
| 3,653,741 | A | | 4/1972 | Marks |
| 3,719,415 | A | | 3/1973 | Rawson |
| 3,969,545 | A | | 7/1976 | Slocum |
| 3,998,524 | A | | 12/1976 | Hubby, Jr. et al. |
| 4,384,760 | A | | 5/1983 | Alferness |
| 4,512,638 | A | | 4/1985 | Sriram et al. |
| 5,365,371 | A | | 11/1994 | Kamon |
| 5,383,053 | A | | 1/1995 | Hegg et al. |
| 5,455,712 | A | | 10/1995 | Yamamoto et al. |
| 5,559,583 | A | | 9/1996 | Tanabe |
| 5,694,247 | A | | 12/1997 | Ophey et al. |
| 5,969,441 | A | | 10/1999 | Loopstra et al. |
| 6,046,851 | A | | 4/2000 | Katayama |
| 6,108,131 | A | | 8/2000 | Hansen et al. |

(Continued)

FOREIGN PATENT DOCUMENTS

DE 196 21 512 A1 12/1997

OTHER PUBLICATIONS

Flagello et al., "Theory of high-NA imaging in homogeneous thin films," *J. Opt. Soc. Am. A.* 13(1):53-64 (1996).

(Continued)

*Primary Examiner*—Ricky D. Shafer
(74) *Attorney, Agent, or Firm*—Pillsbury Winthrop Shaw Pittman, LLP (57) ABSTRACT

A radial transverse electric polarizer device is provided. The device includes a first layer of material having a first refractive index, a second layer of material having a second refractive index, and a plurality of elongated elements azimuthally and periodically spaced apart, and disposed between the first layer and the second layer. The plurality of elongated elements interact with electromagnetic waves of radiation to transmit transverse electric polarization of electromagnetic waves of radiation. One aspect of the invention is, for example, to use such polarizer device in a lithographic projection apparatus to increase imaging resolution. Another aspect is to provide a device manufacturing method including polarizing a beam of radiation in a transverse electric polarization.

26 Claims, 8 Drawing Sheets

U.S. PATENT DOCUMENTS

| | | | |
|---|---|---|---|
| 6,122,103 | A | 9/2000 | Perkins et al. |
| 6,191,880 | B1 | 2/2001 | Schuster |
| 6,262,796 | B1 | 7/2001 | Loopstra et al. |
| 6,288,840 | B1 | 9/2001 | Perkins et al. |
| 6,381,068 | B1 | 4/2002 | Harada et al. |
| 6,392,800 | B2 | 5/2002 | Schuster |
| 6,452,724 | B1 | 9/2002 | Hansen et al. |
| 6,665,119 | B1 | 12/2003 | Kurtz et al. |
| 6,943,941 | B2 * | 9/2005 | Flagello et al. ............. 359/352 |
| 2001/0022687 | A1 | 9/2001 | Takahashi et al. |
| 2002/0167727 | A1 | 11/2002 | Hansen et al. |
| 2002/0176166 | A1 | 11/2002 | Schuster |
| 2004/0227923 | A1 * | 11/2004 | Flagello et al. ............... 355/71 |

OTHER PUBLICATIONS

Lopez et al., "Wave-plate polarizing beam splitter based on a form-birefringenet multilayer grating," *Optics Letters* 23(20):1627-1629 (1998).

Ferstl et al., "High-frequency gratings as polarization elements," *Part of the SPIE Conference on Micromachine Technology for Diffractive and Holographic Optics* 2879:138-146 (1999).

Flagello et al., "Optical Lithography into the Millenium: Sensitivity to Aberrations, Vibration and Polarization," *SPIE The $25^{th}$ Annual International Symposium on Microlithography*, Feb. 27-Mar. 3, 2000, Santa Clara, CA, pp. 1-12.

Switkes et al., "Immersion lithography at 157 nm," *J. Vac. Sci. Technol. B* 19(6):2353-2356 (2001).

Bornzon et al., "Radially and azimuthally polarized beams generated by space-variant dielectric subwavelength gratings," *Optics Letters* 27(5):285-2887 (2002).

Mulkens et al., "157-nm Technology: Where are we Today?," *SPIE The $27^{th}$ Annual Symposium on Microlithography*, Mar. 3-8, 2002, Santa Clara, CA, pp. 1-11.

B. Stenkemp et al., "Grid polarizer for the visible spectral region," SPIE, p. 288-296, 1994.

* cited by examiner

STATIONARY AND DYNAMIC RADIAL TRANSVERSE ELECTRIC POLARIZER FOR HIGH NUMERICAL APERTURE SYSTEMS

CROSS-REFERENCE TO RELATED APPLICATIONS

This application is a continuation of U.S. application Ser. No. 10/374,509, filed Feb. 27, 2003, now U.S. Pat. No. 6,943,941, the entire content of which is incorporated herein by reference.

BACKGROUND OF THE INVENTION

1. Field of the Invention

The present invention relates to optical polarizers in general and more particularly to polarizers for high numerical aperture lithography.

2. Background of the Invention

A lithographic projection apparatus can be used, for example, in the manufacture of integrated circuits (ICs). In such a case, a patterning device generates a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer or substrate will contain a whole network of adjacent target portions that are successively irradiated via the projection system, one at a time.

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device.

An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface.

An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer and the overlay (juxtaposition) of the various stacked layers is performed as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Development of new tools and methods in lithography have lead to improvements in resolution of the imaged features patterned on a device, e.g. an IC. Tools and techniques in optical lithography continue to improve possibly leading to a resolution of less than 50 nm. This may be accomplished using relatively high numerical aperture (NA) lenses (greater than 0.75 NA), wavelengths down to 157 nm, and a plethora of techniques such as phase shift masks, non-conventional illumination and advanced photoresist processes.

The success of manufacturing processes at these sub-wavelength resolutions will rely on the ability to print low modulation images or the ability to increase the image modulation to a level that will give acceptable lithographic yield.

Typically, the industry has used the Rayleigh criterion to evaluate the resolution and depth of focus capability of a process. The resolution and depth of focus (DOF) are given by the following equations:

$$\text{Resolution} = k_1(\lambda/NA),$$

and $$\text{DOF} = k_2(\lambda/NA^2),$$

where $\lambda$ is the wavelength of the illumination source and $k_1$ and $k_2$ are constants for a specific lithographic process.

Therefore, for a specific wavelength, as resolution is increased through the use of higher-NA tools, the depth of focus can decrease. The loss in DOF with high NA is well known. However, the polarization targets for high NA partially coherent systems have not been examined. According to the following equation:

$$I(r, Z_0) = \sum_i \int_s d\rho J(\rho_0) \left| FT\{O(\rho - \rho_0) P_i(\rho) F_i(\rho, z) H(\rho, Z_0) \right.$$

where the image I, in a given film such as a photoresist, is a function of position r and specific for a given focus position $Z_0$. This equation is valid for all NAs and the image is the summation over all polarization states i. The integral is over the source distribution defined by J. The Fourier term within brackets represents the electric field distribution at the exit pupil. The 4 terms inside the bracket are, respectively, the object spectrum O of the reticle pattern, a polarization function P, a film function F and a pupil function H.

According to this equation, high NA imaging is intrinsically linked with the polarization state and the thin film structure, where the electric field coupling and the power absorbed by a photoresist film can be drastically altered. The power absorbed due to incident plane waves on a photoresist film are proportional to the exposure necessary to develop the film.

Studies by Donis G. Flagello et al. published under the title "Optical Lithography into the Millennium: Sensitivity to Aberrations, Vibrations and Polarization," in the 25th Annual International Symposium on Microlithography, SPIE, Feb. 27–Mar. 3, 2002, Santa Clara, Calif., USA, have shown that two orthogonal polarization (Transverse Electric polarization TE and Transverse Magnetic Polarization TM) diverge extensively at high NA, up to a 25% power change. An imaging system would contain a multitude of incident angles, reducing this effect. However, alternating phase shift masks (PSMs) require a small partial coherence which restricts the total number of angles and thus could produce similar exposure changes.

Results have been obtained through simulation which show that a critical dimension difference from a completely polarized state and the unpolarized state depends on the numerical aperture NA. Results have also shown that dense lines with an alternating phase shift mask (PSM) is the most critical feature and this has been explained by the fact that the pupil configuration essentially produces 2-beam interference at the wafer level and this case tends to maximize the effects of polarization. If, for example, a numerical aperture of 0.85 (relatively high) is selected and one wanted to limit the systematic critical dimension CD error to less than 3%, the residual polarization should be limited to 10%. The critical dimension CD is the smallest width of a line or the smallest space between two lines permitted in the fabrication of a device. The simulation results also indicate the level of pupil filling and partial coherence can lessen the effects of polarization. This has been shown by the small polarization influence on the features using conventional illumination.

Therefore, as more phase masks are used and imaging technology that demands small coherence levels is used, newer metrology technologies for the lens may be required. For example, high NA polarization effects may result in extremely tight specifications on illumination polarization for lithography tools.

The advent of a resolution-enhancement technique (RET) called "liquid immersion" promises extending 157 nm optical lithography to well below 70 nm and possibly below 50 nm without changes in illumination sources (lasers) or mask technology. According to a Massachusetts Institute of Technology (MIT) article by M. Switkes et al. entitled "Immersion Lithography at 157 nm" published in J. Vac. Sci. Technology B 19(6), November/December 2001, liquid immersion technology could potentially push out the need for next-generation lithography (NGL) technologies such as extreme ultraviolet (EUV) and electron projection lithography (EPL). The liquid immersion technology involves using chemicals and resists to boost resolution. Immersion lithography can enhance the resolution of projection optical systems with numerical apertures up to the refractive index of the immersion fluid. The numerical aperture NA is equal to the product of the index n of the medium and the sinus of the half angle θ of the cone of light converging to a point image at the wafer (NA=n sin θ). Thus, if NA is increased by increasing the index n, the resolution can be increased (see equation: Resolution=$k_1$ (λ/NA)). However, as stated above, higher NA may result in extremely tight specifications on illumination polarization for lithography tools. Therefore, polarization plays an increased role in immersion lithography.

SUMMARY OF THE INVENTION

It is an aspect of the present invention to provide a radial transverse electric polarizer device including a first layer of material having a first refractive index, a second layer of material having a second refractive index, and a plurality of elongated elements azimuthally and periodically spaced apart, and disposed between the first layer and the second layer. The plurality of elongated elements interact with electromagnetic waves of radiation to transmit transverse electric polarization of electromagnetic waves of radiation.

In one embodiment, the first refractive index is equal to the second refractive index. In another embodiment the plurality of elongated elements form a plurality of gaps. These gaps may include, for example, air or a material having a third refractive index. In yet another embodiment, the elongated elements periodically are spaced apart with a period selected to polarize the electromagnetic waves of radiation in a transverse electric polarization. In one embodiment the electromagnetic radiation is ultraviolet radiation.

It is another aspect of the present invention to provide a radial transverse electric polarizer device including a substrate material having a first refractive index, and a plurality of elongated azimuthally oriented elements coupled to said substrate material and the elongated elements having a second refractive index. The plurality of elements are periodically spaced apart to form a plurality of gaps such that the radial transverse electric polarizer device interacts with an electromagnetic radiation having first and second polarizations to reflect substantially all of the radiation of the first polarization and transmit substantially all of the radiation of the second polarization.

In an embodiment of the present invention the first polarization is a transverse magnetic polarization (TM) and the second polarization is a transverse electric (TE) polarization. The plurality of elongated elements can be formed of, for example, aluminum, chrome, silver and gold. The substrate material can be, for example, quartz, silicon oxide, silicon nitride, gallium arsenide a dielectric material, or combinations thereof.

According to another aspect of the invention a lithographic projection apparatus is provided, the apparatus including a radiation system constructed and arranged to provide a beam of radiation, a support constructed and arranged to supporting a patterning device, the patterning device constructed and arranged to pattern the beam according to a desired pattern, a substrate table to hold a substrate, a projection system constructed and arranged to project the patterned beam onto a target portion of the substrate, and a polarizer device constructed and arranged to polarize the beam of radiation in a transverse electric polarization direction.

A further aspect of the invention there is provided a device manufacturing method including providing a substrate that is at least partially covered by a layer of radiation-sensitive material, providing a beam of radiation using a radiation system, using a patterning device to endow the beam of radiation with a pattern in its cross-section, projecting the patterned beam of radiation onto a target portion of the layer of radiation-sensitive material; and polarizing said beam of radiation in a transverse electric polarization. Still another aspect of the invention is to provide a device manufactured a device using the above method.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. One will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

These and other objects and features of the invention will become more apparent and more readily appreciated from the following detailed description of the presently preferred exemplary embodiments of the invention, taken in conjunction with the accompanying drawings, of which.

DETAILED DESCRIPTION

Several techniques have been used to create polarized light. There are basically four techniques for polarizing a natural beam of light, i.e. non-polarized light. One technique is based on birefringent or biaxial materials. A second technique is based on the use of dichroic materials such as "polaroid." A third technique employs thin-film technology and it uses Brewster's effect. A fourth technique is based on wire grids or conductive gratings.

The use of birefringent materials to polarize light is known in the production of birefringent polarizers. Birefringent polarizers can be made from many crystals and also certain stretched polymers. Birefringent materials are materials having a different optical index in one direction compared to another. The degree of difference in the optical index between the two directions varies with the wavelength of the light. The difference in index is used to separate beams of one linear polarization from another. Use of birefringent polarizers is characterized by inefficiency, wavelength dependent performance and requires highly collimated light. For these reasons birefringent polarizers are not commonly used in optical projection systems.

Dichroic polarizers are polarizers designed to absorb one polarization and transmit the other one. Most commonly used dichroic polarizers consist of a polymeric sheet stretched to orient its molecules and treated with iodine and/or other materials or chemicals such that the molecules absorb polarization of one orientation. Streched polymers polarizers absorb all the intensity of one polarization and at least 15% of the transmitted polarization. Stretched polymer polarizers degrade with time as the light induces chemicals changes in the polymeric material resulting in the material becoming yellow or brittle. Dichroic polarizers are also sensitive to heat and other environmental changes.

In the last decade a polarizer device has been developed in which stretched polymer sheets are made birefringent. These stretched sheets reflect one polarization and pass the other. One problem with this polarizer technique is its low extinction ratio of approximately 15. While useful for some applications, this extinction ratio is not adequate for imaging applications without a secondary polarizer. This type of polarizer also suffers from the environmental problems discussed above.

Thin film polarizer technology uses Brewster's effect in which a light beam incident on a surface of a material such as glass, plastic or the like, at Brewster's angle (near 45 degrees) is divided into two polarized beams one transmitted and the other one reflected. Thin film polarizer technology however limits the angular range of the light beam incidence. The acceptance angular range is very narrowly limited to a few degrees in most devices. Thin film polarizer technology also suffers from the wavelength dependence because of the dependence of Brewster's angle on the wavelength of the incident light.

For an image projection system where applications of a polarized light beam are sought, a brighter beam is always desirable. The brightness of a polarized beam is determined by numerous factors, one of the factors being the light source itself. Another factor for a system that employs a polarizer is the angle of acceptance. A polarizer with a narrow or limited acceptance angle cannot gather as much light from a divergent source as a system that employs a wide acceptance angle. A polarizer with large acceptance angles allows flexibility in the design of a projection optical system. This is because it is not necessary for the polarizer to be positioned and oriented within a narrow range of acceptance angles with respect to the light source.

Another desired characteristic for a polarizer is to effectively separate one component of polarization from the other component. This is called the extinction ratio, which is the ratio of the amount of light of the desired polarization component to the amount of light of the undesired polarization component. Other desired characteristics include freedom of positioning the polarizer in an optical projection system without diminishing the efficiency of the polarizer and/or introducing additional restrictions on the system such as orientation of the beam etc.

Another polarization technique utilizes a conductive grating or wire grid. A wire grid polarizer is a planar assembly of evenly spaced parallel electrical conductors whose length is much larger than their width and the spacing between the conductive elements is less than the wavelength of the highest frequency light component of the incident light beam. This technique has been successfully used for a number of years in the radio frequency domain and up to the infrared region of the spectrum. Waves with a polarization parallel to the conductors (S polarization) are reflected while waves of orthogonal polarization (P polarization) are transmitted through the grid. The wire grid polarizer is used mainly in the field of radar, microwaves, and infrared.

The wire grid polarizer technique has not been used for shorter wavelengths except in few instances in the visible wavelengths range. For example, in U.S. Pat. No. 6,288,840 a wire grid polarizer for the visible spectrum is disclosed. The wire grid polarizer is imbedded in a material such as glass and includes an array of parallel elongated spaced-apart elements sandwiched between first and second layers of the material. The elongated elements form a plurality of gaps between the elements which provide a refractive index less than the refractive index of the first layer. The array of elements is configured to interact with electromagnetic waves in the visible spectrum to reflect most of the light of a first polarization and transmit most of the light of a second polarization. The elements have a period less than 0.3 microns and widths less than 0.15 microns.

Another instance where a wire grid polarizer is used for polarization in the visible spectrum is described in U.S. Pat. No. 5,383,053. A wire grid polarizer is used in a virtual image display to improve reflection and transmission efficiency over conventional beam splitters. The wire grid polarizer is used as a beam splitting element in an on-axis, polarized virtual image display. The extinction ratio of the grid polarizer was not an issue in this application because the image was already polarized and only the relatively high efficiency of the reflection and transmission was of interest in this application.

Lopez et al., in an article published in Optics Letters, Vol. 23, No. 20, pp. 1627–1629, describe the use of surface-relief grating polarization, similar to wire grid technology. Lopez et al. describe the use of grating polarization in the visible spectrum (output of a He-Ne laser at 632.8 nm) as a quarter-wave plate polarizer (phase retardance, $\pi/2$) at normal incidence and as a polarizing beam splitter (PBS) at an angle of incidence of 40°. The polarizer is a one-dimensional surface-relief grating with a period of 0.3 microns and a 50% duty cycle. The grating material is a single layer of $SiO_2$ (index of refraction 1.457) sandwiched between two layers of $Si_3N_4$ (index of refraction 2.20) upon a fused-quartz substrate.

The wire grid polarizer technology has not been, however, suggested for use in the ultraviolet wavelengths range, i.e. shorter than the visible lower limit wavelength of 400 nm. As stated above, development of a polarizer for ultraviolet radiation would allow increases in resolution of lithographic projection systems, and more specifically increases in the resolution of lithographic projection systems having high NA, such as in the case of immersion lithographic systems.

Ferstl et al., in an article published in SPIE Vol. 3879, September 1999, pp. 138–146, discloses the use of "high-frequency" gratings as polarization elements. Binary gratings with feature sizes smaller than the illumination wavelength of 650 nm were fabricated in quartz glass by microstructuring techniques using direct electron-beam writing combined with successive reactive ion etching. In polarization beam splitters diffraction efficiencies of about 80% in the −1 order for transverse electric TE polarization and 90% in the 0 order for transverse magnetic TM polarization were obtained.

The polarization state of a wave can be defined by two parameters θ and φ, where θ defines the relative magnitudes of TE and TM wave components, and φ defines their realtive phase. The incident wave can be expressed by the following pair of equations:

$$A_{TE}=\cos\theta \text{ and } A_{TM}=e^{j\phi}\sin\theta$$

Thus, for φ=0, the wave is linearly polarized at an angle θ. Circular polarization is obtained when θ=π/4 and φ=±π/2. A TE polarized wave is represented by θ=0. A TM wave is represented by θ=π/2. TE and TM polarizations are fundamental polarization components.

Before going into details about polarization systems and polarization lenses it would be judicious to put the polarization in the context of its application, i.e. in the context of lithographic tools and methods.

Figure 1:
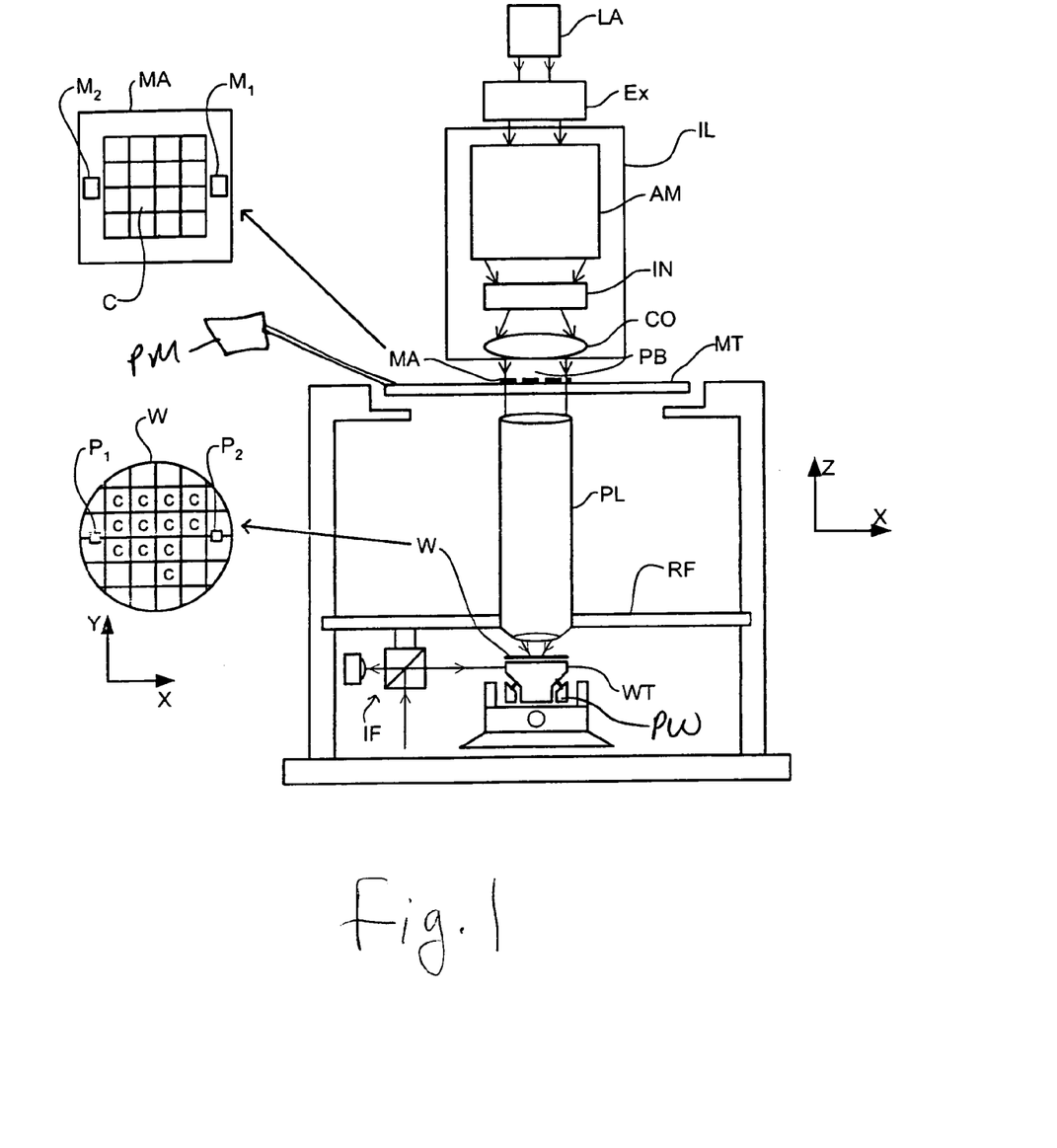
FIG. 1 schematically depicts a lithographic projection apparatus according to an embodiment of the invention.

FIG. 1 schematically depicts a lithographic projection apparatus 1 according to an embodiment of the invention. The apparatus 1 includes a radiation system Ex, IL constructed and arranged to supply a beam PB of radiation (e.g. EUV radiation), which in this particular case also comprises a radiation source LA; a first object table (mask table) MT provided with a mask holder that holds a mask MA (e.g. a reticle), and connected to a first positioning device PM that accurately positions the mask with respect to a projection system PL. A second object table (substrate table) WT provided with a substrate holder that holds a substrate W (e.g. a resist-coated silicon wafer), and connected to a second positioning device PW that accurately positions the substrate with respect to the projection system PL. The projection system ("lens") PL (e.g. a mirror group) is constructed and arranged to image an irradiated portion of the mask MA onto a target portion C (e.g. comprising one or more dies) of the substrate W.

As here depicted, the apparatus is of a transmissive type (i.e. has a transmission mask). However, in general, it may also be of a reflective type, for example (with a reflective mask). Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes. In step mode, the mask table MT is kept essentially stationary, and an entire mask image is projected at once, i.e. a single "flash,"onto a target portion C. The substrate table WT is then shifted in the X and/or Y directions so that a different target portion C can be irradiated by the beam PB.

In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Currently, lenses that are used in projection lithography do not use TE polarizers. They either have linear polarization or circular polarization. The polarization state in the lithography tools used prior to the present invention are either linear, circular or unpolarized. The inventors have determined that in order to improve resolution and allow better imaging under high NA, such as in immersion lithography where NA is greater than 1, it will require suppression of TM polarization for all feature orientations. Otherwise the loss of contrast would be severe enough to destroy any viable imaging.

In order to eliminate TM polarization and only use TE polarization in lithographic projection, the inventors have found that using radial polarizers in circularly symmetric lenses allows for selective elimination of the TM polarization component. The manufacture of radial polarizers is similar to that of wire grid technology described previously. It is accomplished by the manufacture of radial periodic metal lines such as, for example chrome or silver, dielectrics or multilayers, either on a lens element or embedded within the lens element.

Figure 2A:
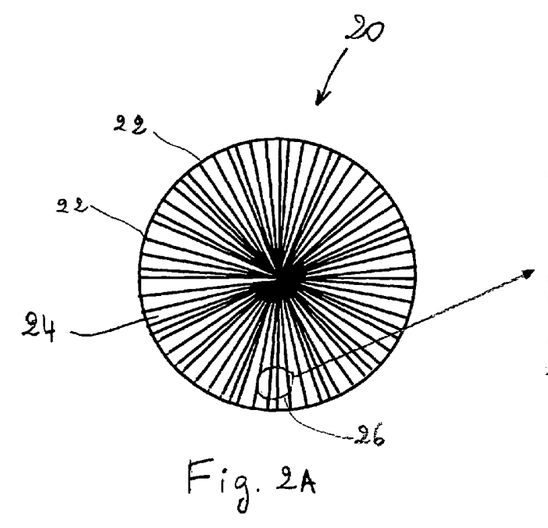
FIG. 2A is a schematic illustration of a radial polarizer according to an embodiment of the present invention.

FIG. 2A is a schematic illustration of an embodiment of a radial polarizer according to the present invention. Radial polarizer 20 has period gratings 22 arranged in a radially symmetric pattern. The period of the grating can be selected for a specific wavelength of radiation used and in accordance with other desired parameters. In this embodiment, the gratings are deposited on a substrate 24, which can be glass or other materials. The gratings 22 can be, for example, a metal such as aluminum, chrome, silver, gold or any material that is conductive at the wavelength the electromagnetic radiation beam. The gratings can also be made, for example, of dielectrics or a combination in a multilayer structure such as, but not limited to, a single layer of $SiO_2$ sandwiched between two layers of $Si_3N_4$ on a fused-quartz substrate. The gratings 22 may also be etched using electron beams, for example, following a pattern transferred to a substrate of GaAs.

Figure 2B:
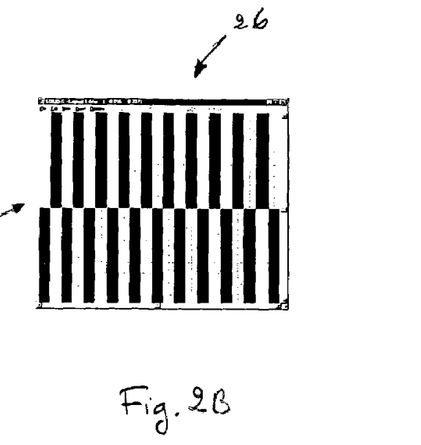
FIG. 2B is an enlarged view of gratings at an area of polarizer depicted in FIG. 2A.

FIG. 2B is an enlarged view of gratings 22 at area 26 of polarizer 20. As shown in FIG. 2B gratings 22 are interlaced to allow smooth transitions of the polarization effects to maintain uniformity of the TE polarization intensity along the diameter of the polarizer.

Although the polarizer 22 is illustrated in FIG. 2A having a disk shape, the polarizer 20 can also be of a polygonal shape such as, but not limited to, a rectangular shape, hexagonal shape, etc.

Figure 3:
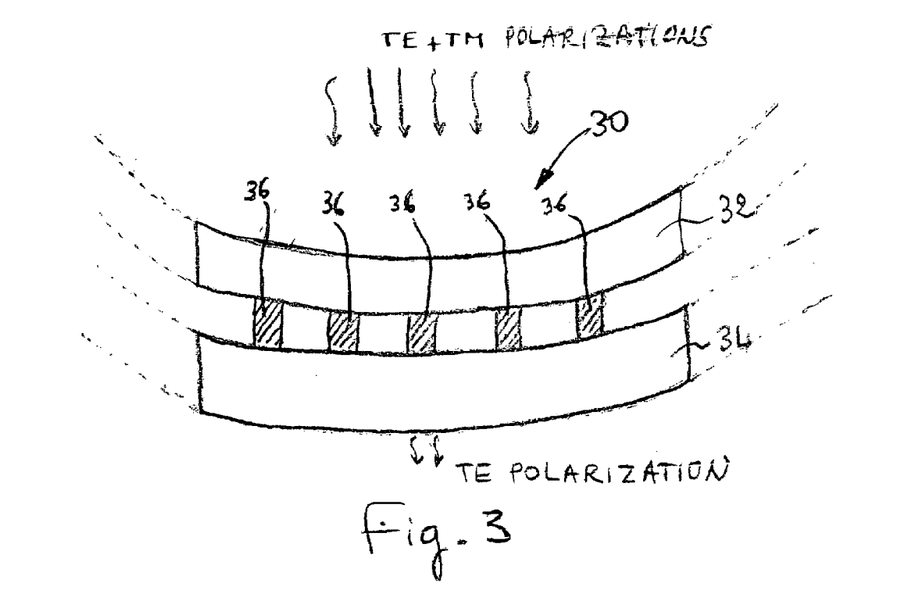
FIG. 3 is an enlarged lateral view of the radial polarizer according to another embodiment of the present invention.

FIG. 3 is an enlarged lateral view of another embodiment of the radial polarizer. Radial polarizer 30 includes a first layer of material 32 having a first refractive index, a second layer of material 34 having a second refractive index. A plurality of elongated elements 36 (or gratings) azimuthally and periodically spaced apart are disposed between the first layer 32 and the second layer 34. The plurality of elongated elements 36 interact with electromagnetic waves of light or radiation to transmit transverse electric TE polarization and reflect or absorb TM polarization. The plurality of elongated elements 36 can be made, for example, of silicon dioxide and the first and/or second layers 32 and/or 34 can be made of any material comprising, for example, quartz, silicone, dioxide, silicon nitride, gallium arsenide etc. or a dielectric material at the wavelength of the electromagnetic beam of radiation. Similarly to the previous embodiment the spacing or period between the elongated elements 36 can be selected according to the intended use of the polarizer, i.e. for a specific wavelength and in accordance with other parameters in the lithographic system.

Similarly, although the polarizer 30 is illustrated in FIG. 3 having a disk shape, the polarizer 30 can also be of a polygonal shape such as, but not limited to, a rectangular shape, hexagonal shape, etc.

Light impinging on polarizer 20, 30 at near normal incidence would have its polarization state altered such that the output of transmitted polarization state is orthogonal to the direction of the grating lines 22, 36 in the polarizer 20, 30.

Figure 4:
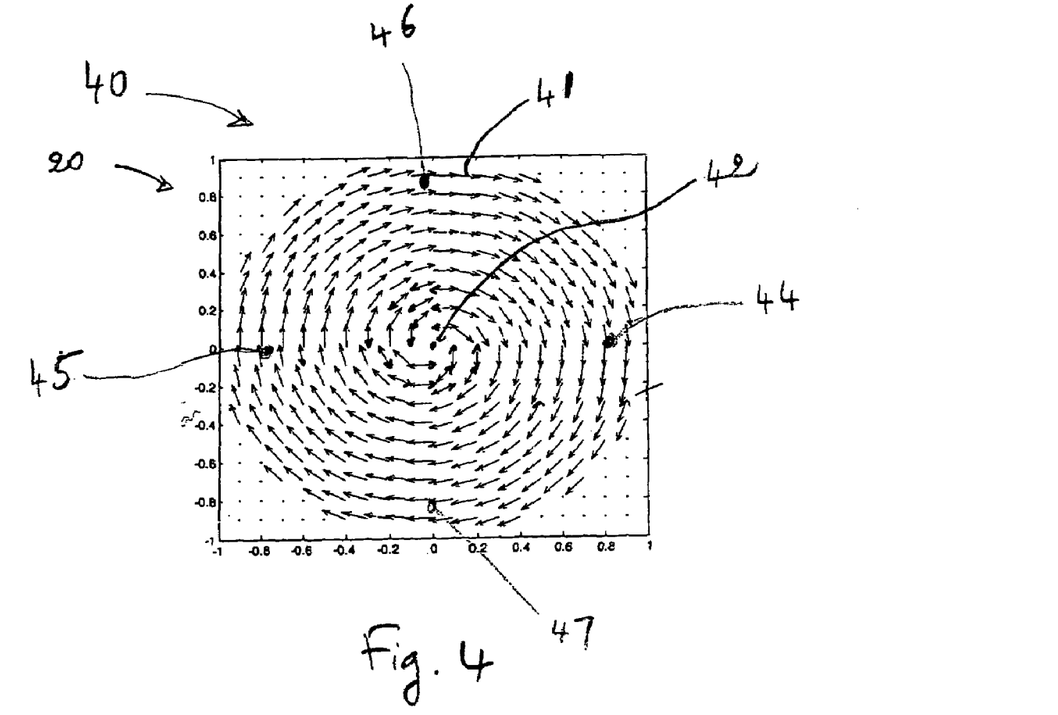
FIG. 4 is a vector diagram showing the preferential polarization direction and the output from a TE polarizer according to the embodiments shown in FIGS. 2A and 3.

FIG. 4 is a vector diagram 40 with the preferential polarization direction 41 and output from TE polarizer 20. Higher errors and defects would be allowed towards the center of the polarizer as the need for TE polarization with high NA systems is greater at the edge of the pupil. A coherent light illuminating through dense lines (reticle image lines) will produce 3 orders of diffraction. At 42 would be the position of the 0 order diffraction of the beam of light and at 44 and 45, the respective positions of the +1 order diffraction and −1 order diffraction, for a vertical line. At 46 and 47, the respective positions of +1 order diffraction and −1 order of diffraction, for a horizontal line. The +1 and −1 order will interfere giving rise to valleys and peaks in the illumination reaching the wafer. If a TE polarization is used, for both vertical and horizontal lines, an interference pattern occurs leading to a high contrast and thus to a good resolution of the lines.

Whereas, in the case of linear polarization only one of the vertical or horizontal lines would lead to a clear interference pattern with high contrast. The other vertical or horizontal line would not be correctly polarized, not form an interference pattern and thus the contrast would be less. The combination of high and low contrast images would average out the result leading to a low definition or resolution imaging for the overall pattern. To get rid of the component leading to absence or minor interference at the wafer the inventors used a radial TE polarizer that allows interference patterns to occur in any azimuthal direction in the lens. This would not be the case with circular polarization as each component is a combination of two linear orthogonal polarizations but can be thought of as turning in space but in a fixed manner as function of position. Therefore, the use of circular polarization would not lead to interference lines and consequently is not suitable for high resolution imaging for lithographic systems because in the wafer plane circular polarization is reduced to linear polarization and the drawbacks of this were described above in this paragraph.

Figure 5:
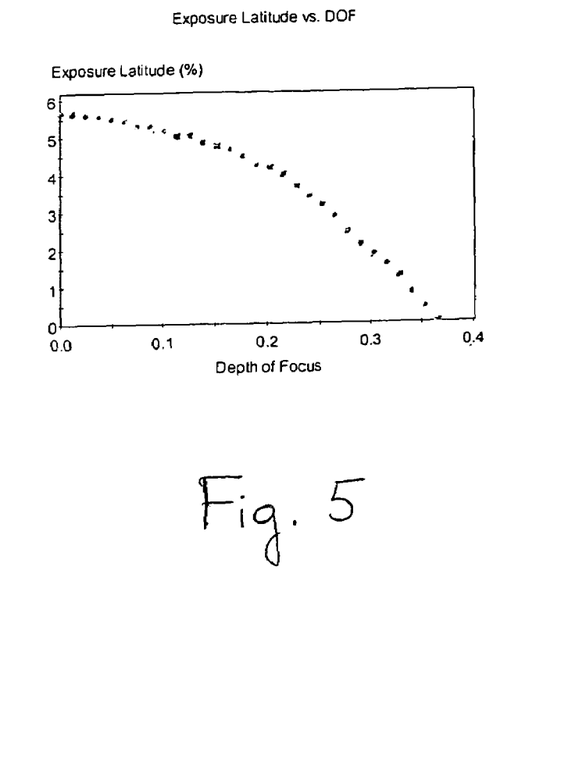
FIG. 5 is a plot of the exposure latitude versus depth of focus for a comparative example 1.

In an immersion lithographic system, i.e. a lithographic system with a high NA, the use of a TE polarizer may be required in order to obtain the resolution adequate for imaging dense lines. FIG. 5 shows the process window for a comparative Example 1 unpolarized immersion lithographic system imaging 50 nm dense lines. The wavelength of use in this example is 193 nm. The immersion fluid used is water with a refractive index of 1.437 (NA=1.437). The air equivalent numerical aperture NA is 1.29. The resist used in this example is Par710 on a matched substrate. The illumination is annular with σ=0.9/0.7. FIG. 5 is a plot of the exposure latitude versus depth of focus for comparative Example 1. This plot indicates that the exposure latitude at a depth of focus of 0.0 is approximately 5.6%, which is an unusable level. At other depth of focus the exposure latitude decreases even more which makes an unpolarized light unusable in lithographic system at high NA.

Figure 6:
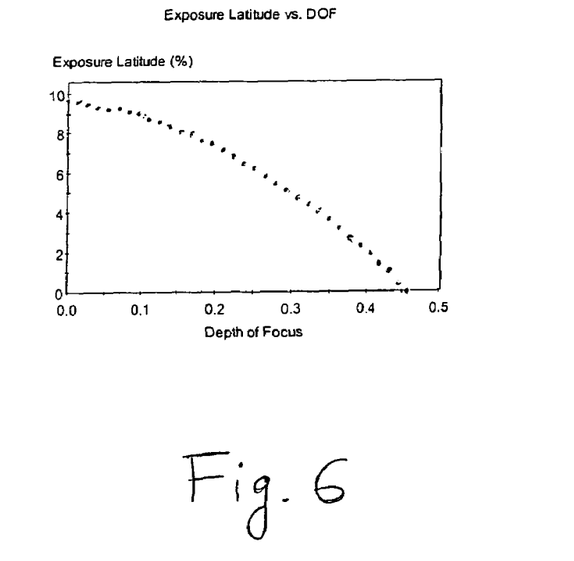
FIG. 6 is a plot of the exposure latitude versus depth of focus for an example 1 of the present invention.

FIG. 6 shows the process window for a 50 nm dense lines with TE polarized light and immersion optics according to an Example 1 of the present invention. The wavelength of use in this example is 193 nm. The immersion fluid used is water with a refractive index of 1.437 (NA=1.437). The resist used, in this example, is Par710 on a matched substrate. The illumination is annular with σ=0.9/0.7. FIG. 6 is a plot of the exposure latitude amount versus depth of focus. This plot indicates that the exposure latitude at a depth of focus of 0.0 is approximately 9.9%, which is a usable level. An improvement in exposure latitude of 75% is obtained when using TE radial polarization system of Example 1 of the present invention compared to comparative Example 1. An improvement in DOF of 27% is obtained in Example 1 of the present invention compared to comparative Example 1. Thus an increased processed window is enabled by the use of the TE polarizer of the present invention. At other depth of focus the exposure latitude decreases with the increase of the depth of focus.

Figure 7:
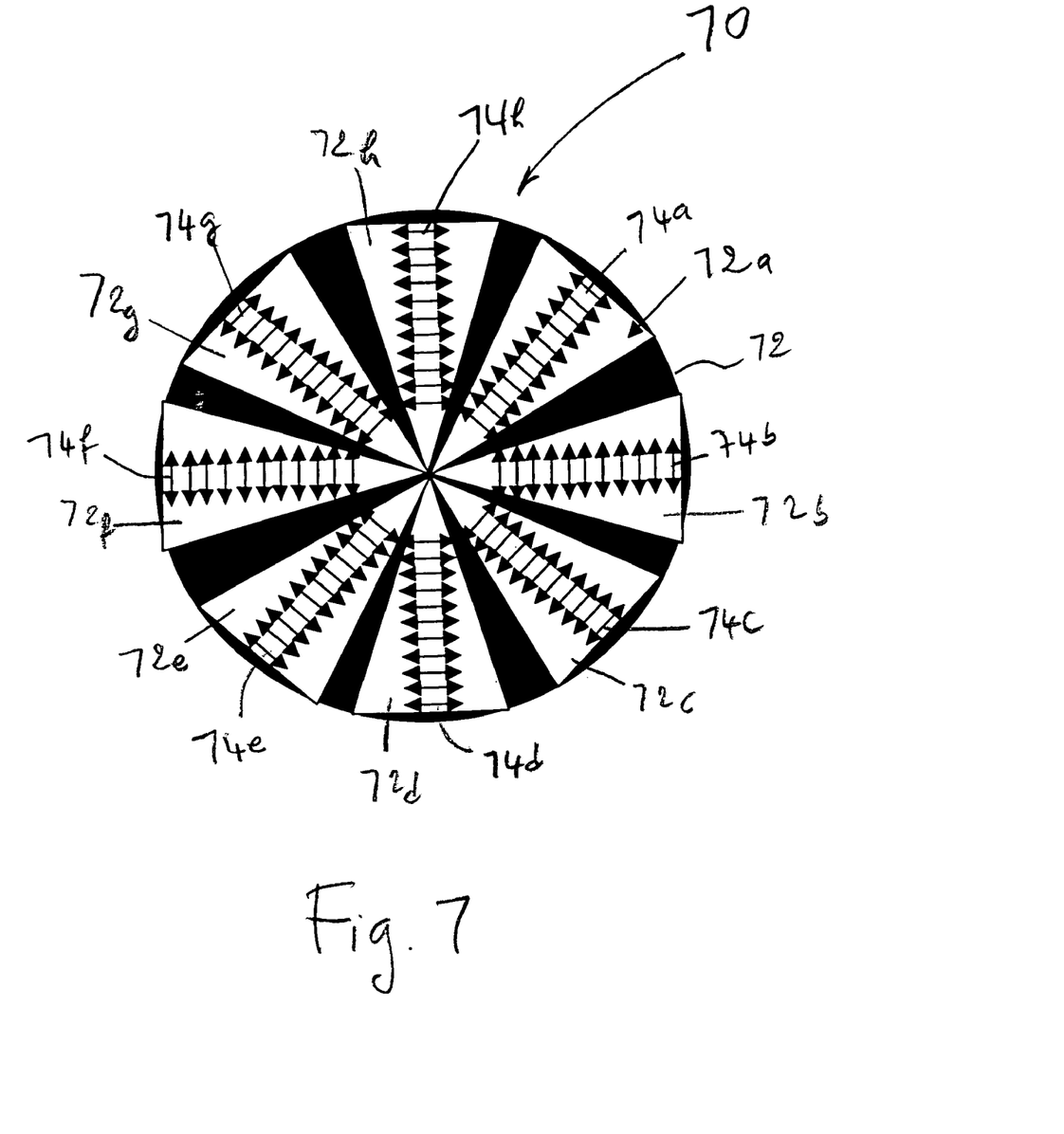
FIG. 7 is a schematic illustration of a radial polarizer according to an alternative embodiment of the present invention.

FIG. 7 is a schematic illustration of another embodiment of a radial polarizer according to the present invention. Radial TE polarizer 70 is comprised of a plurality of plate polarizers. Radial polarizer 70 is fabricated by cutting the plate polarizer 72 that have linear polarization preference. The plate polarizers are cut into plate sectors 72a–h in order to fabricate a circular-shaped piece polarizer. The plate sectors 72a–h are then assembled to form a radial polarizer 70. Each plate sector 72a–h has a linear polarization vector state 74a–h and thus by assembling the plate sectors 72a–h in this fashion the linear vector polarization 74a–h would rotate to form radial polarization configuration. However, since the plate sectors are discrete elements, in order to obtain a "continuous" TE radial polarization, polarizer 70 is preferably rotated to randomize optical path differences between the plates and to insure uniformity. The rotation of the polarizer is not necessary but in some cases it would add uniformity and depending on how the rotation is implemented, the speed of the rotation could be selected to be very slow or very fast. To perform such rotation the polarizer 70 can be mounted for example on air bearings. In the case of EUV lithography where at least parts of the lithographic system are in vacuum, an alternative mount solution can be provided. For example, the polarizer 70 can be mounted on magnetic bearing systems instead of air bearings. The speed of rotation would govern the uniformity of the polarization. In general, the rotation rate should be sufficiently high to randomize optical path differences between the plates in order to insure uniformity.

Figure 8:
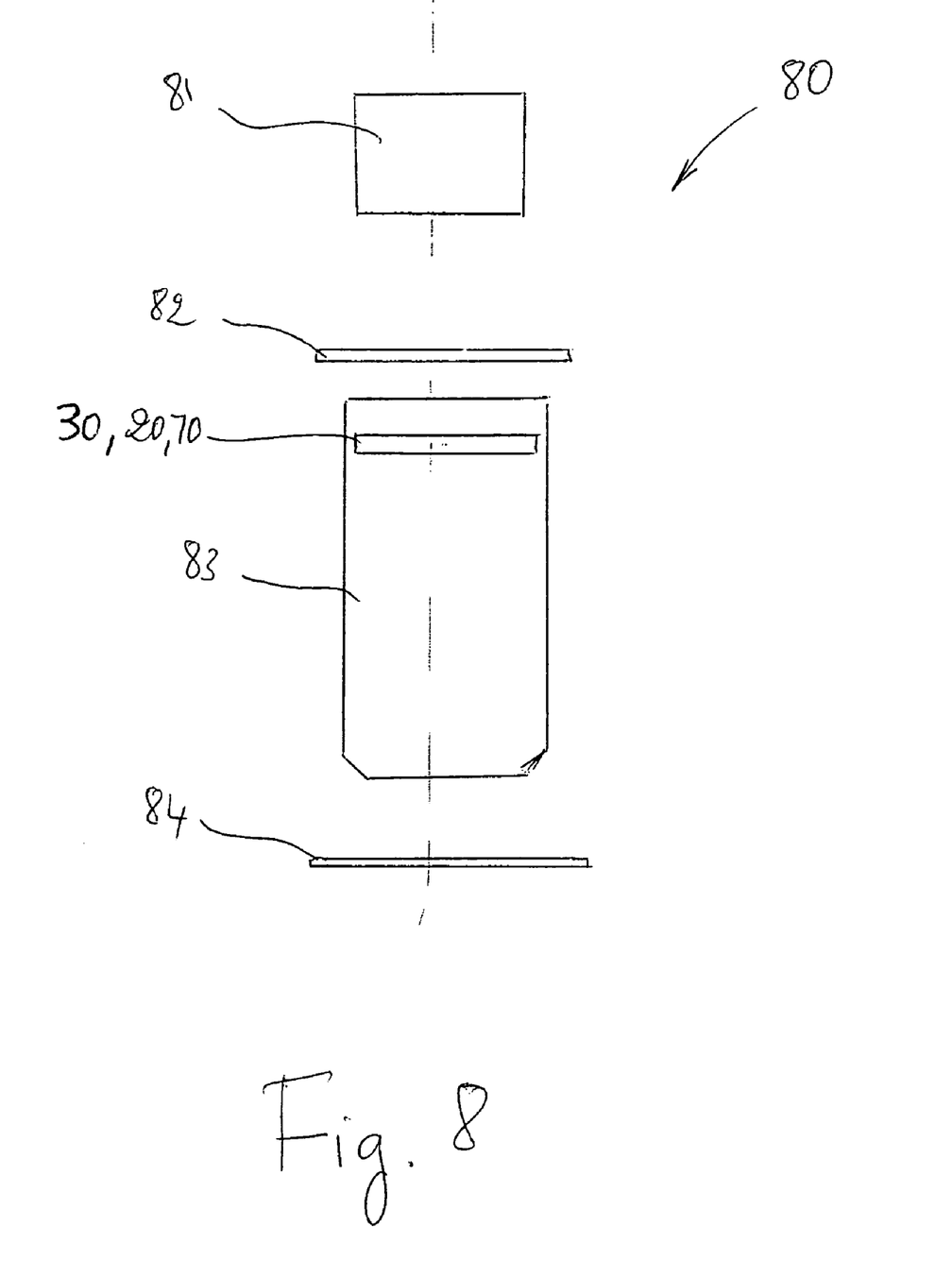
FIG. 8 shows schematically an embodiment of a lithographic system utilizing the radial TE polarizer of the present invention.

FIG. 8 shows schematically an embodiment of a lithographic system utilizing a radial TE polarizer of the present invention. As described previously, lithographic system 80 comprises illumination or radiation system source 81, mask or reticle 82, projection lens 83, substrate or wafer 84 and a radial TE polarizer 20, 30, or 70. The radial TE polarizer 20, 30, or 70 is shown in this embodiment positioned at the entrance of the projection lens, optimally close to the pupil plane, however, one ordinary skill in the art would appreciate that the radial polarizer 20, 30, or 70 can be positioned anywhere in the projection lens or outside the projection lens such as, for example, between the reticle or mask 82 and the projection lens 83.

Figure 9:
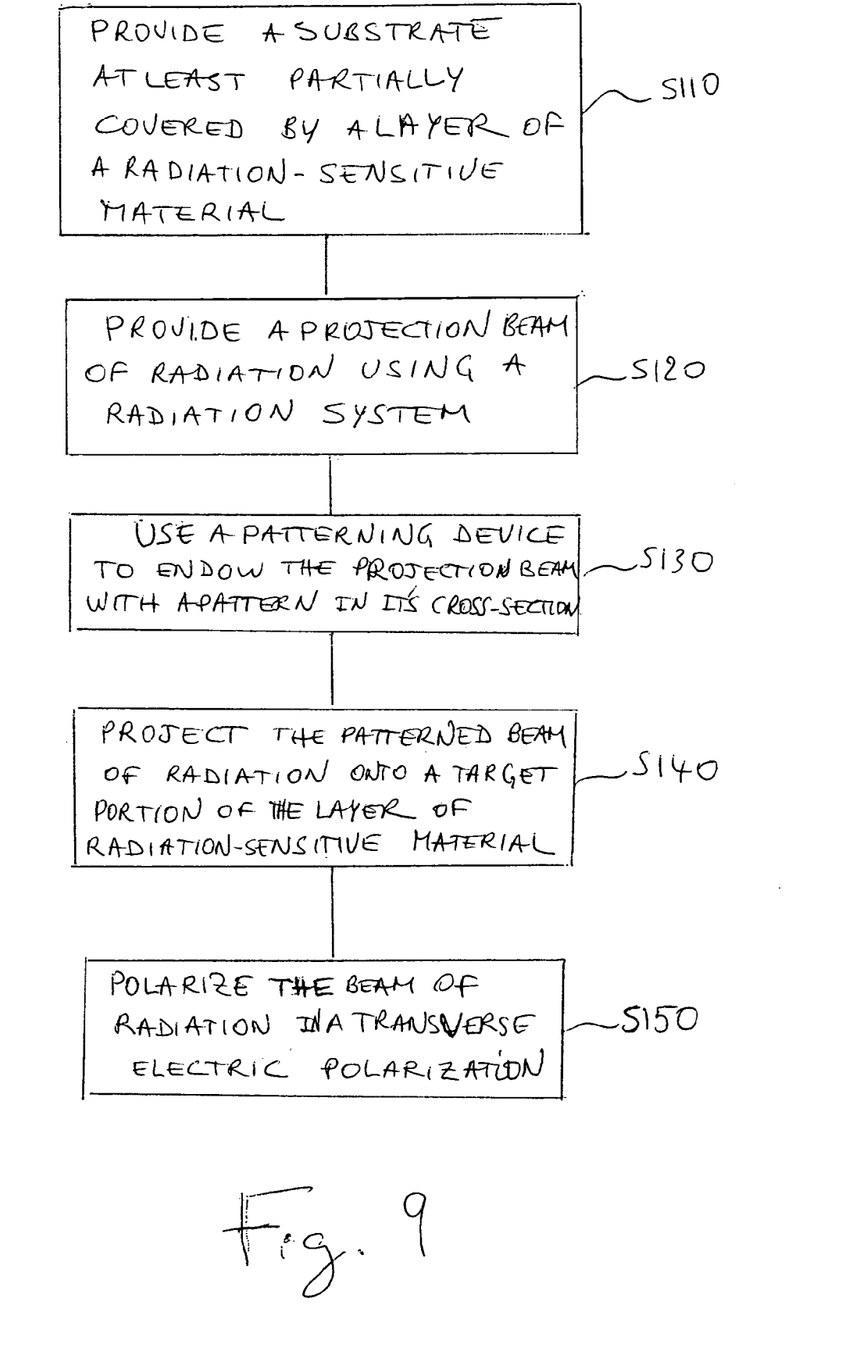
FIG. 9 is flow-chart representing a device manufacturing method according to the present invention.

Referring to FIG. 9, a device manufacturing method according to the present invention includes providing a substrate that is at least partially covered by a layer of radiation-sensitive material S110, providing a beam of radiation using a radiation system S120, using a patterning device to endow the beam with a pattern in its cross-section S130, projecting the patterned beam of radiation onto a target portion of the layer of radiation-sensitive material S140, and polarizing the beam of radiation in a transverse electric polarization S150.

Figure 10:
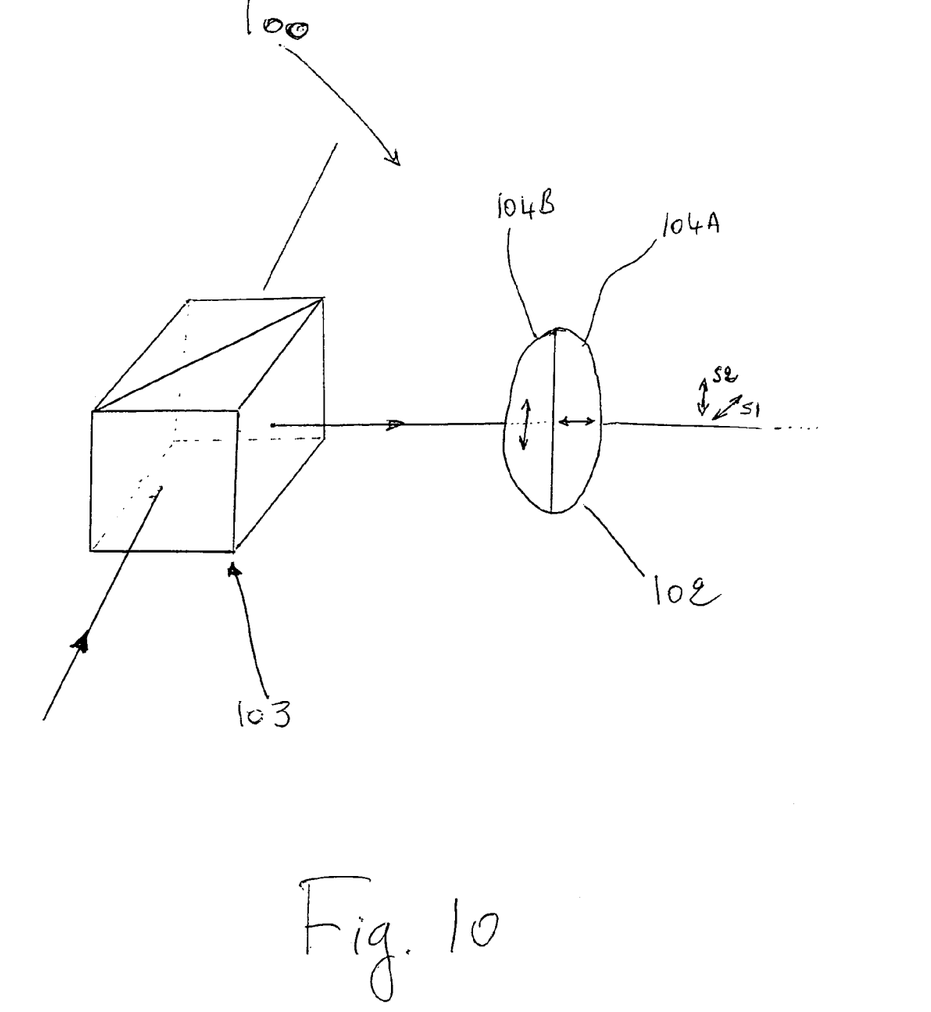
FIG. 10 is a schematic illustration of another embodiment of a polarizer according to the present invention.

FIG. 10 is a schematic illustration of another embodiment of a polarizer 100 according to the present invention used to create tangential polarization. Conventional polarization systems are known to use polarization units such as beam-splitting cubes. Beam-splitting cubes consist of a pair of fused silica precision right-angle prisms carefully cemented together to minimize wave front distortion. The hypotenuse of one of the prisms is coated with a multilayer polarizing beam-splitter coating (such as a birefringent material) optimized for a specific wavelength. The beam-splitter throws away an amount of incident light, and at the exit from the cube, in one of the two branches, the light is linearly polarized. Conventionally, in order to prevent differences in printing horizontal and vertical lines, the polarization is rendered circular with a quarter wave plate, in the pupil of the imaging system.

However as stated previously, circular polarization is comprised of both fundamental polarization components TE and TM. In accordance with the present invention, a polarizer plate 102 is introduced in the pupil of the imaging system comprising the cube beam-splitter 103. In one embodiment, the plate polarizer 102 comprises two half-wave plates 104A and 104B. The plate polarizer 102 polarizes the linear polarized light into a first s-polarized light S1 and a second s-polarized light S2 such that a wave vector S1 of the first s-polarized light and a wave vector S2 of the second polarized light are perpendicular to each other. The plate polarizer is disposed at the end of the cube-beam-splitter 103 such that one polarization direction is limited to only two quarters of the pupil. This is suitable for printing horizontal lines since the polarization arrives as s-polarization on the wafer. In the other two quarters segments, a half-wave phase shift is introduced through birefringence (under 45 degrees). The polarization that was sagital will rotate over 90 degrees and becomes also tangential. This, in turn, is suitable for printing vertical lines. In other words, the first s-polarized light S1 is used to print lines on a wafer in a horizontal direction and the second s-polarized light S2 is used to print lines on a wafer in a vertical direction. In this way, S-polarization or TE polarization is obtained for both vertical and horizontal lines.

Furthermore, since numerous modifications and changes will readily occur to those of skill in the art, it is not desired to limit the invention to the exact construction and operation described herein. Moreover, the process, method and apparatus of the present invention, like related apparatus and processes used in the lithographic arts tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A radial transverse electric polarizer device, comprising:
    a substrate material having a first refractive index; and
    a plurality of elongated azimuthally oriented elements coupled to the substrate material, the elongated elements having a second refractive index,
    wherein the plurality of elements are periodically spaced apart to form a plurality of gaps such that the radial transverse electric polarizer device is configured to interacts with an electromagnetic radiation with a wavelength less than 400 nm to transmit a first polarization of the electromagnetic radiation and the plurality of elongated azimuthally oriented elements are periodically spaced about an angle extending 360 degrees.

2. A radial transverse electric polarizer device according to claim 1,
    wherein the plurality of elements are periodically spaced apart to form the plurality of gaps such that the radial transverse electric polarizer device is configured to interacts with the electromagnetic radiation to reflect a second polarization of the electromagnetic radiation.

3. A radial transverse electric polarizer device according to claim 2,
    wherein the first polarization of the electromagnetic radiation is a transverse electric polarization and the second polarization of the electromagnetic radiation is a transverse magnetic polarization.

4. A radial transverse electric polarizer device according to claim 1,
    wherein the plurality of elongated elements are formed of an electrically conductive material at a wavelength of the electromagnetic radiation.

5. A radial transverse electric polarizer device according to claim 4,
    wherein the electrically conductive material is selected from the group of aluminum, chrome, silver and gold.

6. A radial transverse electric polarizer device according to claim 1,
wherein the substrate material is formed of a dielectric material at a wavelength of the electromagnetic radiation.

7. A radial transverse electric polarizer device according to claim 6,
wherein the dielectric material is selected from the group of quartz, silicon oxide, silicon nitride, gallium arsenide or combinations thereof.

8. A radial transverse electric polarizer device according to claim 1,
wherein the substrate material comprises a dielectric material.

9. A radial transverse electric polarizer device according to claim 1,
wherein a wavelength range of the electromagnetic radiation is in an ultraviolet spectrum.

10. A radial transverse electric polarizer device according to claim 9,
wherein the wavelength range is between 365 nm and 126 nm.

11. A radial transverse electric polarizer device according to claim 9,
wherein the wavelength range is in the extreme ultraviolet.

12. A radial transverse electric polarizer device according to claim 1,
wherein the plurality of elongated elements are concentric.

13. A radial transverse electric polarizer device according to claim 1,
wherein the first refractive index of the substrate material is different from the second refractive index of the elongated elements.

14. A radial transverse electric polarizer device according to claim 1, further comprising a layer of material disposed on top of the plurality of elongated elements so as to sandwich the elongated elements between the substrate material and the layer, the layer of material having a third refractive index.

15. A radial transverse electric polarizer device according to claim 14,
wherein the first refractive index of the substrate material is equal to the third refractive index of the layer of material.

16. A radial transverse electric polarizer device according to claim 14,
wherein the gaps include air.

17. A radial transverse electric polarizer device according to claim 14,
wherein the gaps include a material having a fourth refractive index.

18. A radial transverse electric polarizer device according to claim 14,
wherein the elongated elements are spaced apart with a period selected to polarize the electromagnetic radiation in a transverse electric polarization.

19. A radial transverse electric polarizer device according to claim 14,
wherein the electromagnetic radiation is ultraviolet radiation.

20. A lithographic projection apparatus, comprising:
a radiation system constructed and arranged to provide a beam of radiation;
a support constructed and arranged to support a patterning device, the patterning device constructed and arranged to pattern the beam of radiation according to a desired pattern;
a substrate table configured to hold a substrate;
a projection system constructed and arranged to project the patterned beam onto a target portion of the substrate; and
a polarizer device constructed and arranged to polarize the beam of radiation in a radial transverse electric polarization direction, the polarizer device comprising:
a substrate material having a first refractive index; and
a plurality of elongated azimuthally oriented elements coupled to the substrate material, the elongated elements having a second refractive index,
wherein the plurality of elements are periodically spaced apart to form a plurality of gaps such that the radial transverse electric polarizer device is configured to interacts with an electromagnetic radiation with a wavelength less than 400 nm to transmit a first polarization of the electromagnetic radiation and the plurality of elongated azimuthally oriented elements are periodically spaced about an angle extending 360 degrees.

21. A lithographic projection apparatus according to claim 20,
wherein the plurality of elements are periodically spaced apart to form the plurality of gaps such that the radial transverse electric polarizer device is configured to interacts with the electromagnetic radiation to reflect a second polarization of the electromagnetic radiation.

22. A lithographic projection apparatus according to claim 21,
wherein the first polarization of the electromagnetic radiation is a transverse electric polarization and the second polarization of the electromagnetic radiation is a transverse magnetic polarization.

23. A lithographic projection apparatus according to claim 20,
wherein the plurality of elongated elements are formed of an electrically conductive material at a wavelength of the electromagnetic radiation.

24. A lithographic projection apparatus according to claim 20,
wherein a wavelength range of the electromagnetic radiation is in an ultraviolet spectrum.

25. A lithographic projection apparatus according to claim 20,
wherein the polarizer device further comprises a layer of material disposed on top of the plurality of elongated elements so as to sandwich the elongated elements between the substrate material and the layer, the layer of material having a third refractive index.

26. A lithographic projection apparatus according to claim 25,
wherein the first refractive index of the substrate material is equal to the third refractive index of the layer of material.

* * * * *

UNITED STATES PATENT AND TRADEMARK OFFICE
CERTIFICATE OF CORRECTION

| | | |
|---|---|---|
| PATENT NO. | : 7,221,501 B2 | Page 1 of 1 |
| APPLICATION NO. | : 11/106480 | |
| DATED | : May 22, 2007 | |
| INVENTOR(S) | : Donis Flagello et al. | |

It is certified that error appears in the above-identified patent and that said Letters Patent is hereby corrected as shown below:

On title page, item 75 Inventors
  replace "Donis Flagello, Scottsdale, AZ (US); Kevin Cummings, Phoenix, AZ (US); Alexander Straaijer, Eindhoven (NL)"
  with --Donis Flagello, Scottsdale, AZ (US); Kevin Cummings, Phoenix, AZ--.

Signed and Sealed this

Sixth Day of November, 2007

JON W. DUDAS
*Director of the United States Patent and Trademark Office*